(12) United States Patent
Yu et al.

(10) Patent No.: US 11,734,554 B2
(45) Date of Patent: Aug. 22, 2023

(54) POOLING PROCESSING METHOD AND SYSTEM APPLIED TO CONVOLUTIONAL NEURAL NETWORK

(71) Applicant: Tencent Technology (Shenzhen) Company Limited, Guangdong (CN)

(72) Inventors: Xiaoyu Yu, Guangdong (CN); Yuwei Wang, Guangdong (CN); Bo Zhang, Guangdong (CN); Lixin Zhang, Guangdong (CN)

(73) Assignee: Tencent Technology (Shenzhen) Company Limited, Shenzhen (CN)

( * ) Notice: Subject to any disclaimer, the term of this patent is extended or adjusted under 35 U.S.C. 154(b) by 0 days.

(21) Appl. No.: 18/047,716

(22) Filed: Oct. 19, 2022

(65) Prior Publication Data
US 2023/0062238 A1 Mar. 2, 2023

Related U.S. Application Data

(63) Continuation of application No. 16/678,726, filed on Nov. 8, 2019, now Pat. No. 11,537,857, which is a
(Continued)

(30) Foreign Application Priority Data

Nov. 1, 2017 (CN) .......................... 201711059065.3

(51) Int. Cl.
*G06N 3/063* (2023.01)
*G06N 3/02* (2006.01)
(Continued)

(52) U.S. Cl.
CPC ............. *G06N 3/063* (2013.01); *G06F 17/15* (2013.01); *G06F 17/16* (2013.01); *G06F 30/13* (2020.01);
(Continued)

(58) Field of Classification Search
CPC .......... G06F 17/15; G06F 17/16; G06F 30/18; G06F 30/13; G06F 30/27; G06F 30/15; G06F 30/17; G06N 3/063; G06N 3/02
(Continued)

(56) References Cited

U.S. PATENT DOCUMENTS

| | | | |
|---|---|---|---|
| 4,945,496 | A | 7/1990 | Kurakake et al. |
| 5,784,649 | A | 7/1998 | Begur et al. |

(Continued)

FOREIGN PATENT DOCUMENTS

| | | | |
|---|---|---|---|
| CN | 106779060 | A | 5/1917 |
| CN | 106156781 | A | 11/2016 |

(Continued)

OTHER PUBLICATIONS

Shafiee et al., "ISAAC: A Convolution Neural Network Accelerator with In-Situ Analog Arithmetic in Crossbars", https://users.cs.utah.edu/~rajeev/pubs/isca16.pdf, Oct. 5, 2016, 13 pages. (Year: 2016).*
(Continued)

*Primary Examiner* — Phallaka Kik
(74) *Attorney, Agent, or Firm* — Crowell & Moring LLP

(57) ABSTRACT

This application discloses a pooling processing method, applied to a pooling processing system of a convolutional neural network. The method includes receiving a feature map comprising a width dimension and a height dimension; establishing a data region comprising k+m columns and n rows, k, m, and n being integers; transferring data blocks each of size k in width and size n in height from the feature map in a width-height sequential scanning order into columns m+1 to k+m and rows 1 to n of the data region in pooling cycles; and in each pooling cycle corresponding to a data block transferred from the feature map to the data region: retaining columns k+1 to k+m of the data region of a previous pooling cycle to columns 1 to m of the data
(Continued)

region; performing a first level pooling within each column of the data region to obtain k+m first level pooling values; and performing P second level pooling values by pooling P sets of first level pooling values selected according to a position of the data block relative to a width boundary in the feature map, P being an integer.

20 Claims, 5 Drawing Sheets

Related U.S. Application Data continuation of application No. PCT/CN2018/109267, filed on Oct. 8, 2018.

(51) Int. Cl.
 *G06F 17/15*   (2006.01)
 *G06F 17/16*   (2006.01)
 *G06F 30/18*   (2020.01)
 *G06F 30/15*   (2020.01)
 *G06F 30/17*   (2020.01)
 *G06F 30/13*   (2020.01)
 *G06F 30/27*   (2020.01)

(52) U.S. Cl.
 CPC .............. *G06F 30/15* (2020.01); *G06F 30/17* (2020.01); *G06F 30/18* (2020.01); *G06F 30/27* (2020.01); *G06N 3/02* (2013.01)

(58) Field of Classification Search
 USPC ....... 706/15, 20, 23, 25, 29; 703/1, 2, 4, 16, 703/20
 See application file for complete search history.

(56) References Cited

U.S. PATENT DOCUMENTS

| | | | |
|---|---|---|---|
| 6,044,225 A | 3/2000 | Spencer et al. | |
| 6,879,504 B1 | 4/2005 | Lien et al. | |
| 8,125,847 B2 | 2/2012 | Kim et al. | |
| 10,713,537 B2 * | 7/2020 | Heide | .................... G06V 10/82 |
| 11,295,176 B2 * | 4/2022 | Heide | .................... G06V 10/82 |
| 11,537,857 B2 * | 12/2022 | Yu | ............................ G06F 17/16 |
| 2008/0010502 A1 | 1/2008 | Baek | |
| 2009/0154237 A1 | 6/2009 | Tokiwa | |
| 2012/0230130 A1 | 9/2012 | Sheppard | |
| 2017/0323196 A1 | 11/2017 | Gibson | |
| 2017/0337313 A1 | 11/2017 | Abdul | |
| 2020/0074289 A1 * | 3/2020 | Yu | ............................ G06T 1/20 |

FOREIGN PATENT DOCUMENTS

| | | |
|---|---|---|
| CN | 106156807 A | 11/2016 |
| CN | 106203619 A | 12/2016 |
| CN | 106250103 A | 12/2016 |
| CN | 106355244 A | 1/2017 |
| CN | 106845375 A | 6/2017 |
| CN | 106875012 A | 6/2017 |
| CN | 106940815 A | 7/2017 |
| CN | 106991472 A | 7/2017 |
| CN | 106991473 A | 7/2017 |
| CN | 107013449 A | 8/2017 |
| CN | 107239824 A | 10/2017 |
| DE | 202017103694 U1 | 11/2017 |
| EP | 2511787 B1 | 9/2017 |
| WO | WO 2016/155564 A1 | 10/2016 |

OTHER PUBLICATIONS

Wei Zhang et al, "Learning structure of stereoscopic image for no-reference quality assessment with convolutional neural network", Pattern Recognition 59 (2016) 176-187.

Liu Wanjun et al., "Learning Performance of Convolutional Neural Networks with Different Pooling Models", College of Software, Liaoning Technical University, Huludao 125105, China, 13 pages, 2016, English abstract.

* cited by examiner

POOLING PROCESSING METHOD AND SYSTEM APPLIED TO CONVOLUTIONAL NEURAL NETWORK

RELATED APPLICATION

This application is a continuation application of and claims the benefit of priority to the U.S. non-provisional patent application Ser. No. 16/678,726, now U.S. Pat. No. 11,537,857 B2, filed on Nov. 8, 2019 which is a continuation application of and claims the benefit of priority to the International PCT Patent Application No. PCT/CN2018/109267 filed with the Chinese Patent Office on Oct. 8, 2018, which is further based on and claims the benefit of priority to Chinese Patent Application No. 201711059065.3 filed with the Chinese Patent Office on Nov. 1, 2017, all entitled "POOLING PROCESSING METHOD AND SYSTEM APPLIED TO CONVOLUTIONAL NEURAL NETWORK". These prior patent applications are incorporated herein by reference in their entireties.

FIELD OF THE TECHNOLOGY

This application relates to the field of computer technologies, and in particular, to a pooling processing method, a pooling processing system, a computer device, a chip system, and a computer readable storage medium applied to a convolutional neural network.

BACKGROUND OF THE DISCLOSURE

In recent years, with the ongoing research on deep learning, a convolutional neural network (CNN) has been developed to implement precise image recognition and classification, and has been widely applied in technical fields such as medical imaging, security, biometric feature recognition, robotics, and self-driving or autonomous vehicles. CNN has become one of the major research directions in deep learning.

A CNN usually includes two major steps or technical components: convolution and pooling. In convolution, sliding convolution is performed on an input image or two or three-dimensional data (for two-dimensional or three-dimensional input image) based on a configurable stride by using a two or three-dimensional convolution kernel, until the whole image or data is traversed. The convolution kernel has a relatively small size. In each sliding process or position in the input image or data, a data region having the same size as the convolution kernel is obtained from the image or the data. At the same time, a weight value of a corresponding position in the convolution kernel is multiplied by data in the data region, and then a sum is calculated for the data region. Weight values in the convolution kernel are obtained through training.

An image has an attribute of being static, which means that a feature useful in one image area is probably also applicable in another image area. Therefore, to describe a large image, statistics on features of different positions may be aggregated. For example, a mean value or a maximum value of a particular feature of multiple positions in one area of an image may be calculated to represent the feature of this area, and this process is referred to as pooling.

In most model frameworks implemented by the CNN, regardless of whether the pooling is of a mean-pooling mode or a max-pooling mode, the usage frequency of pooling operations ranks only second to the usage frequency of convolution operations. Using a 3*3 pooling window as an example, data at nine positions needs to be read during calculation of a convolutional feature at each position, and this has a high requirement on bandwidth. Because the convolution step occupies most of the computing resources, pooling often lags behind, resulting in low processing efficiency of the CNN.

SUMMARY

Embodiments of this application provide a pooling processing method, which can implement data multiplexing or reuses through a data region, thus reducing the numbers of data reading, improving the efficiency of pooling processing, improving processing efficiency of a CNN, and resolving the problem of low processing efficiency of the CNN due to time lagging of pooling in the related technology. The embodiments of this application further provide a corresponding pooling processing system, a computer device, a chip system, and a computer readable storage medium.

According to an aspect of this application, a pooling processing method applied to a convolutional neural network is provided. The method is applied to a pooling processing system, and the pooling processing system includes a first storage device, a data region, a pooling kernel (alternatively referred to as pooling computation kernel), and a pooling controller. The method includes:

reading, by the pooling controller, k pieces of feature data from the first storage device in each reading cycle, the k pieces of feature data being included in a feature map generated by a convolution operation, and k being an integer greater than 1;

writing, by the pooling controller, the read k pieces of feature data into the data region, the k pieces of feature data being arranged in a first direction, n*k pieces of data arranged in the first direction in n queues being written into the data region in an updating cycle, duration of the updating cycle being n times duration of the reading cycle, and n being an integer greater than 1; and transmitting, after the updating cycle is ended, data in the data region to the pooling kernel to perform a pooling operation, the data in the data region including the n*k pieces of data and last m queues of data that are arranged before the n*k pieces of data and that are arranged in a second direction in a previous updating cycle, last m queues of data arranged in the second direction in the updating cycle being temporarily stored in the data region for use in a next updating cycle, and m being a positive integer.

According to another aspect of this application, a pooling processing system of a convolutional neural network is provided. The pooling processing system includes a first storage device, a data region, a pooling kernel, and a pooling controller;

the pooling controller is configured to read k pieces of feature data from the first storage device in each reading cycle, the k pieces of feature data being included in a feature map generated by a convolution operation, and k being an integer greater than 1;

the pooling controller is configured to write the read k pieces of feature data into the data region, the k pieces of feature data being arranged in a first direction, n*k pieces of data arranged in the first direction in n queues being written into the data region in an updating cycle, duration of the updating cycle being n times duration of the reading cycle, and n being an integer greater than 1; and transmit, after the updating cycle is ended, data in the data region to the pooling kernel to perform a pooling operation, the data in the data region including the n*k pieces of data and last m queues of data that are arranged before the n*k pieces of data and that are arranged in a second direction in a previous updating cycle, last m queues of data arranged in the second direction in the updating cycle being temporarily stored in the data region for use in a next updating cycle, and m being a positive integer.

According to still another aspect of this application, a computer device is provided. The computer device includes a processor, a memory, and a field programmable gate array (FPGA) circuit; the FPGA circuit includes a pooling apparatus; the pooling apparatus is included in a pooling processing system; the pooling processing system includes a pooling controller; the pooling apparatus includes a data region and a pooling kernel; the memory includes a first storage device and another storage device; the another storage device stores at least one instruction; the instruction is loaded and executed by the FPGA circuit to implement the following operations:

reading k pieces of feature data from the first storage device in each reading cycle, the k pieces of feature data being included in a feature map generated by a convolution operation, and k being an integer greater than 1;

writing the read k pieces of feature data into the data region, the k pieces of feature data being arranged in a first direction, n*k pieces of data arranged in the first direction in n queues being written into the data region in an updating cycle, duration of the updating cycle being n times duration of the reading cycle, and n being an integer greater than 1; and transmitting, after the updating cycle is ended, data in the data region to the pooling kernel to perform a pooling operation, the data in the data region including the n*k pieces of data and last m queues of data that are arranged before the n*k pieces of data and that are arranged in a second direction in a previous updating cycle, last m queues of data arranged in the second direction in the updating cycle being temporarily stored in the data region for use in a next updating cycle, and m being a positive integer.

According to still another aspect of this application, a chip system is provided. The chip system includes an FPGA circuit and/or an application specific integrated circuit (ASIC), and the FPGA circuit and/or the ASIC is configured to perform the pooling processing method.

According to still another aspect of this application, a computer readable storage medium is provided. The computer readable storage medium includes instructions. The instructions, when run on a computer device, enable the computer device to perform the pooling processing method.

According to still another aspect of this application, a computer program product including instructions is provided. When run on a computer, the computer program product enables the computer to perform the pooling processing method.

In the pooling processing method provided in the embodiments of this application, the pooling processing system includes a data region. Data multiplexing or reuse is implemented through the data region, thus reducing the number of data reading times, improving the efficiency of pooling processing, and improving processing efficiency of a CNN. Moreover, the number of feature data read each time is greater than 1, and the amount of feature data read each time is increased, thus improving a throughput capability of pooling processing.

DESCRIPTION OF EMBODIMENTS

Embodiments of this application are described in the following with reference to the accompanying drawings. Apparently, the described embodiments are merely examples, rather than all of the possible embodiments of this application. It may be appreciated by a person of ordinary skill that, with the development of technologies and emergence of new application scenarios, the technical solutions provided in the embodiments of this application are also applicable to similar technical problems.

An embodiment of this application provides a pooling processing method applicable to a convolutional neural network, which can implement data multiplexing or reuse through a data region or data buffer, thus reducing the number of data reading operations, improving the efficiency of pooling processing, and improving processing efficiency of a CNN. An embodiment of this application further provides a corresponding pooling processing system of a convolutional neural network, a chip system, and a computer readable storage medium, which are described in detail below.

The CNN can implement precise image recognition and classification, and has been widely applied in technical fields such as medical imaging, security, biometric feature recognition, robotics, and self-driving or autonomous vehicles. In the following, by using a facial recognition application scenario shown in FIG. 1A as an example, a face image processing procedure performed by a CNN in a facial recognition process is described with reference to a CNN processing procedure shown in FIG. 1B. In other application scenarios, all CNN processes related to image analysis can be adapted with reference to the CNN processing procedure in the facial recognition process described below.

Figure 1A:
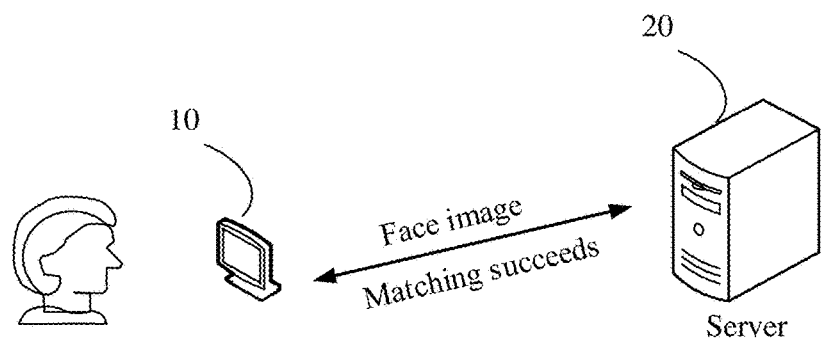
FIG. 1A is a schematic diagram of an example of a facial recognition application scenario.

As shown in FIG. 1A, the facial recognition application scenario includes a terminal device 10 and a server 20. The server 20 may be an independent computer device or may be a server cluster. The server 20 includes a convolutional neural network. The convolutional neural network may be used to perform the CNN processing procedure.

For example, when a user performs attendance checking by using a terminal device 10 having a face scanning function, the terminal device 10 captures a face image of the user. Then, the terminal device 10 uploads the face image of the user to the server 20. The server 20 performs the CNN processing procedure shown in FIG. 1B after receiving the face image, to recognize the face image of the user.

Figure 1B:
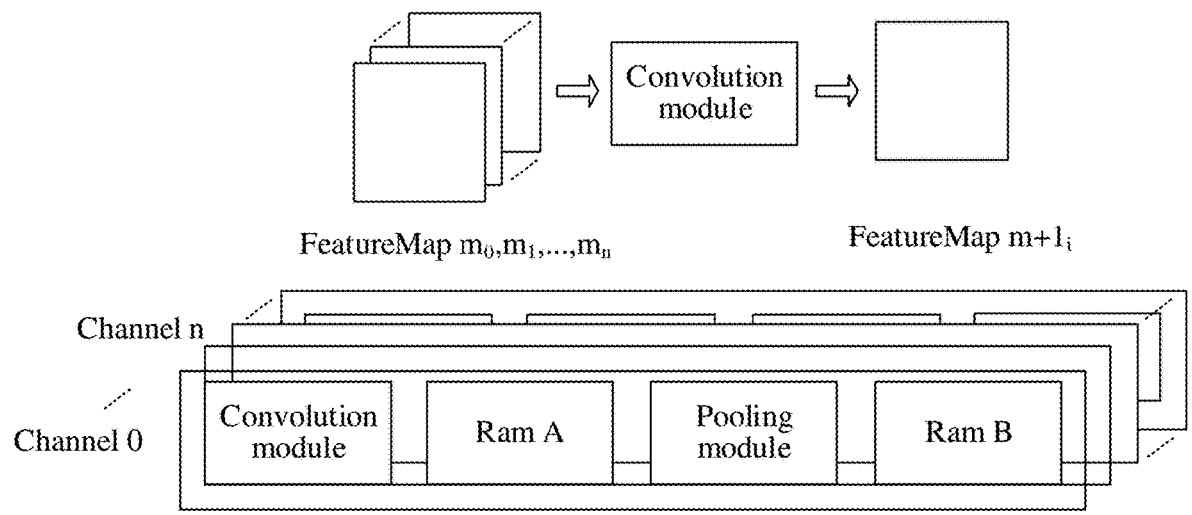
FIG. 1B is a schematic diagram of a CNN processing procedure in an example embodiment of this application.

FIG. 1B is a schematic diagram of a CNN processing procedure in an example embodiment of this application. The CNN processing procedure is performed by a convolution module, a first storage device, a pooling module, and a second storage device. The convolution module is configured to perform a convolution operation. The first storage device is configured to store data in a feature map generated by the convolution operation. The pooling module is configured to read data from the first storage device and perform a pooling operation. The second storage device is configured to store a pooling result of the pooling module.

As shown in FIG. 1B, the CNN processing procedure includes a convolution process and a pooling process. In the convolution process, for each convolution, convolution operation is performed on input multi-dimensional feature maps FeatureMap $m_0, m_1, \ldots, m_n$ and a corresponding multi-dimensional kernel (convolution kernel), to output a new feature map FeatureMap$(m+1)_i$. The face image in FIG. 1A may include multiple multi-dimensional feature maps at the m layer. Therefore, convolution may be performed cyclically to obtain multiple feature maps at the m=1 layer, and the convolution module writes the outputted feature maps into a Ram A. The Ram A may be the first storage device. The pooling module is disposed after the convolution module, reads feature map data from the Ram A to perform a pooling operation, and writes a pooling result into the Ram B. The Ram B may be the second storage device. The pooling can implement dimension reduction of the feature map. For example, if a feature map for convolution has a size of 24*24, the size may be reduced to 12*12 or lower through pooling.

Corresponding to the application scenario in FIG. 1A, after performing the convolution operation and the pooling operation, the server 20 stores the feature data of the face image in the second storage device. The data in the second storage device may be compared and matched with pre-stored facial feature data of various users. If facial data in the pre-stored facial feature data with similarity to the data from the second storage device meeting a preset threshold is obtained through matching, the server returns a response indicating successful matching to the terminal device 10.

Figure 2:
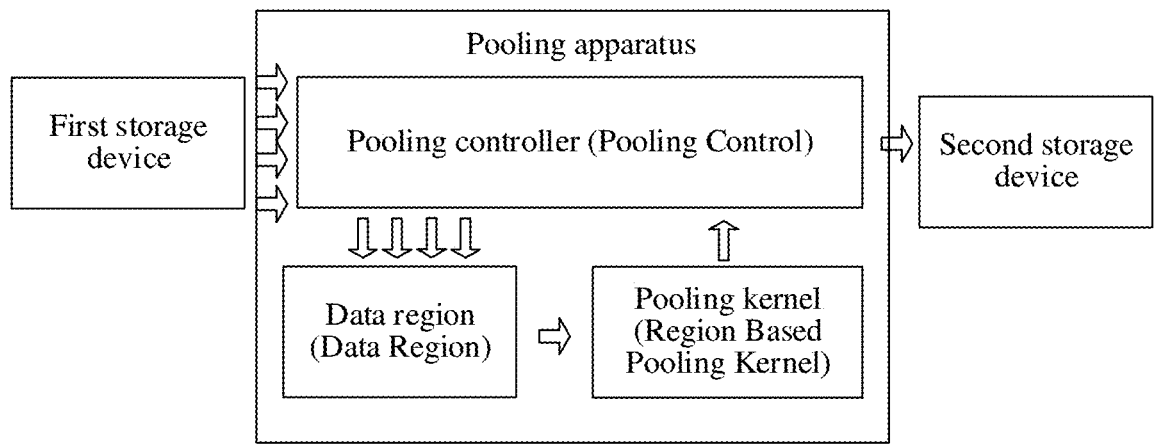
FIG. 2 is a schematic structural diagram of a pooling processing system in an example embodiment of this application.

FIG. 2 is a schematic diagram of a pooling processing system in an example embodiment of this application.

As shown in FIG. 2, the pooling processing system includes a first storage device, a data region, a pooling kernel (alternatively referred to as pooling computation kernel), a pooling controller, and a second storage device. The data region, the pooling kernel, and the pooling controller may belong to the same pooling apparatus. Alternatively, the data region and the pooling kernel may belong to a pooling apparatus, and multiple pooling apparatuses may share one pooling controller.

The data region is configured to store feature data of a feature map read from the first storage device in each reading cycle. The pooling controller updates the data region in each updating cycle. Duration of the updating cycle is n times duration of the reading cycle, and n is an integer greater than 1.

The data region has a corresponding size, for example three rows and six columns (for two-dimensional images and two-dimensional kernels and feature maps), that is, a size of 3*6. Alternatively, the data region may also have another size. The size of the data region may be set according to a bit width of the first storage device. The bit width of the first storage device may be a bit bandwidth for reading feature data from the first storage device, and may represent the amount of data that can be read per unit time.

In a pooling process of feature data, different columns of feature data from a previous updating cycle may be used in pooling calculation in a current updating cycle depending on a kernel size of the pooling kernel. Therefore, feature data in a previous updating cycle needs to be temporarily stored in the data region. The feature data in the previous updating cycle, for example may be placed in the front m columns of the data region. For example, if the kernel size is 3*3, m=2 (because pooling of current updating cycle may involve 2 previous columns of feature data). In this embodiment of this application, the kernel size is determined by the quantities of rows and columns of data pooled by the pooling kernel.

When in operation, the pooling controller first reads parameters in Table 1, then reads feature data from the first storage device according to the parameters in Table 1, and then writes the read feature data into the data region.

TABLE 1

| Operation Parameters of Pooling | | |
|---|---|---|
| Name | Value | Meaning |
| FM_Width | — | FeatureMap width |
| FM_Height | — | FeatureMap height |
| Stride | 1, 2 | Stride between centers of two neighboring pooling operations in original FeatureMap |
| Padding | 0, 1 | Whether boundary expansion is needed |

FM_Width in Table 1 is a width of the feature map. FM_Height is a height of the feature map. Stride is a step of a pooling sliding window, Stride=1 represents that the sliding window (pooling kernel) moves by one piece of data each time, and Stride=2 represents that the sliding window moves by two pieces of data each time. Padding represents whether boundary expansion is needed. For example, Padding=0 may indicate that boundary expansion is needed whereas Padding=1 may indicates that boundary expansion is not needed. Alternatively, Padding=0 may be used to indicate that boundary expansion is not needed whereas Padding=1 indicates that boundary expansion is needed. In the following examples, Stride=1 is taken as an example for description. The underlying principles described below may be extended and applied to the case where Stride=2.

In the embodiments of this application, an embodiment of the pooling processing method may include:

reading, by the pooling controller, k pieces of feature data from the first storage device in each reading cycle, wherein the k pieces of feature are read from a feature map generated by a convolution operation, and wherein k is an integer greater than 1, and the value of k corresponding to a size of the data region in a first direction;

writing, by the pooling controller, the k pieces of feature data read from the first storage into the data region in a reading cycle, where the k pieces of feature data being arranged in the first direction and writing, by the pooling controller, n*k pieces of data arranged in the first direction in n groups of k data into the data region in an updating cycle, wherein a duration of the updating cycle is n times the duration of the reading cycle, and wherein n is an integer greater than 1; and transmitting, after the updating cycle is ended, data in the data region to the pooling kernel to perform a pooling operation, wherein the data in the data region include the n*k pieces of data and the last m groups of data from previous updating cycle, wherein the m groups data are arranged in front of the n*k pieces of data in the data region and that are each arranged in a second direction in the data region, wherein the last m groups of data from the previous updating cycle are temporarily stored in the data region for use in a pooling of the current updating cycle, wherein the last m group of data from the current updating cycle may be retained for the next updating cycle for calculating next pooling, and wherein m is a positive integer.

That is, the first storage device stores feature maps generated by convolution operations. Each feature map includes a matrix of feature data. In each reading cycle, the pooling controller reads k pieces of feature data from the first storage device and writes the k pieces of feature data into the data region. The k pieces of feature data are arranged in the first direction in the data region, to form a group (or a row, see below) of data. In the next reading cycle, the pooling controller still reads k pieces of feature data from the first storage device and writes the k pieces of feature data into the data region, to form a next group (or a row, see below) of data. The duration of the updating cycle is n times the duration of the reading cycle. Therefore, in one updating cycle, a total of n groups (or rows, see below) of data, that is, n*k pieces of data in total, are written into the data region. After the updating cycle is ended, data is extracted from the data region and is transmitted to the pooling kernel to perform a pooling operation.

Figure 3:
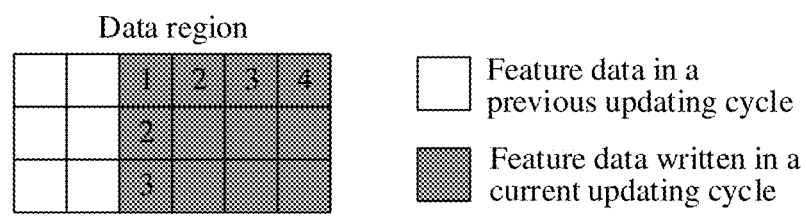
FIG. 3 is a schematic diagram of a data region in an example embodiment of this application.

The value of k is determined according to a bit width of the first storage device. For example, k=4. The feature map includes multiple pieces (or a matrix) of feature data, for example, the feature map has a size of 12*12. In this case, the feature map includes 12*12=144 pieces of feature data. The data region is usually a region arranged based on rows and columns. If the first direction indicates rows, the second direction indicates columns. On the contrary, if the first direction indicates columns, the second direction indicates rows. In the following embodiment of the embodiments of this application, description is made by using an example in which the first direction indicates a direction along the rows and the second direction indicates a direction along the columns. FIG. 3 is a schematic diagram of an example of a data region.

Figure 4:
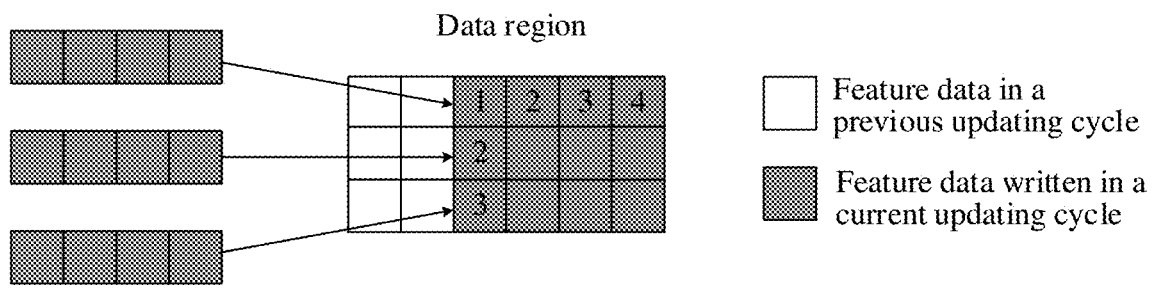
FIG. 4 is a schematic diagram for writing data to a data region in an example embodiment of this application.

In FIG. 3, the data region includes three rows and six columns. The first two columns store feature data in the previous updating cycle (m=2 groups), and the last four columns are configured to store feature data read in the current updating cycle. Four pieces of feature data (a row) are read in each reading cycle and written into the same row of the data region. In this exemplary scenario, n=3. In this case, in an updating cycle, the pooling controller reads 12 pieces of feature data in three times, and thus writes 12 pieces of feature data into the data region. Processes of reading feature data from the data region and writing feature data into the data region may be comprehended with reference to FIG. 4. The size of the feature map is FM_Width× FM_Height. For feature data in the feature map, reading is performed cyclically until the feature data in FM_Width× FM_Height is traversed, so that all the feature data in the feature map is read.

In this exemplary application scenario, the reading cycle may be a clock cycle. Every three clock cycles (n=3) form an updating cycle. The data region is updated every three clock cycles. When the data region is updated, the feature data in the data region is synchronized to the pooling kernel, so that the pooling kernel performs a pooling operation on the data in the data region.

When the data in the data region is synchronized to the pooling kernel, last two columns of feature data are temporarily stored in the data region, to be used in the next updating cycle for calculating pooling in the next updating cycle. Other data already synchronized may be deleted from the data region, to save storage space, and the storage space is used to store feature data of a next feature map.

It can be learned from the foregoing solution that, data is written into the data region according to the reading cycle. Data in the data region is transmitted to the pooling kernel according to the updating cycle, to perform a pooling operation. The updating cycle is n times the reading cycle. Multiplexing or reuse of feature data can be implemented through the data region, thus reducing the number of feature data readings, improving the efficiency of pooling processing, and improving the processing efficiency of a CNN. Moreover, in this embodiment of this application, the bit width of the first storage device may be further increased, thus increasing the number of pieces of feature data read each time, and also increasing the throughput of pooling processing.

In a possible implementation, the method further includes:

determining, by the pooling kernel, a first-level pooling value of each first-level pooling data unit, the first-level pooling data unit being each column of data along the second direction, and the first-level pooling value being a maximum value of data included in the first-level pooling data unit or a sum (or average) value of data included in the first-level pooling data unit; and determining, by the pooling kernel, a second-level pooling result of the data in the data region according to each first-level pooling data unit and a pooling window size of the pooling kernel, the pooling window size being quantities of rows and columns of data pooled by the pooling kernel.

Figure 5:
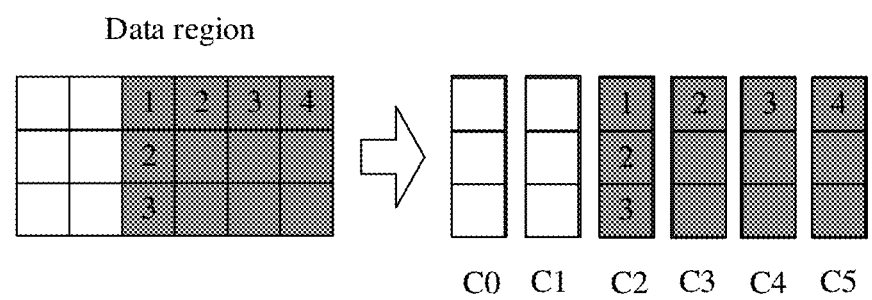
FIG. 5 is a schematic diagram of first-level pooling data units of feature data in an example embodiment of this application.

The pooling process of the pooling kernel may be comprehended with reference to FIG. 5. In FIG. 5, each column of data in the data region is used as a first-level pooling data unit, and a first-level pooling value of each first-level pooling data unit is determined first. First-level pooling values of the six operators in FIG. 5 are C0, C1, C2, C3, C4, and C5 respectively. If the pooling process is max-pooling, C0, C1, C2, C3, C4, and C5 are each a maximum value of three pieces of data of the corresponding first-level pooling data unit (a column in FIG. 5). If the pooling process is mean-pooling, C0, C1, C2, C3, C4, and C5 are each a sum value corresponding to each first-level pooling data unit (a column).

The determining, by the pooling kernel, a second-level pooling result of the data in the data region according to each first-level pooling data unit and a kernel size may include:

selecting, by the pooling kernel, first-level pooling values associated every p adjacent first-level pooling data units, and determining a second-level pooling value over a p×p area, p×p being the kernel size, the second-level pooling value being a maximum first-level pooling values of the p first-level pooling data unit or a mean value of the first-level pooling values of the p first-level pooling data units over p×p feature data, and the second-level pooling result including the second-level pooling value of the every p adjacent first-level pooling data units.

For example, the kernel size of the pooling window of the pooling kernel is p×p. The feature data in the data region is traversed by using the pooling kernel. That is, data of adjacent p first-level pooling data unit in a p×p area may be selected each time during the traverse, and the second-level pooling values of the selected data is determined.

In a max-pooling mode, a maximum value of the first-level pooling values in the p first-level pooling data units is used as a second-level pooling value; in a mean-pooling mode, a mean value of first-level pooling values of the p first-level pooling data units over p×p is used as a second-level pooling value. The mean value of the first-level pooling values of the p first-level pooling data units over p×p refers to a ratio of a sum value of the first-level sum pooling values of the p first-level pooling data units to p×p.

In this exemplary application scenario, for example, if the pooling window size of the pooling kernel is 3*3, during second-level pooling, second-level pooling is further performed on every three adjacent first-level pooling data units. Considering that data included in C0 to C5 of Table 1 may be located on a boundary, in the pooling operation process, data for the pooling operation may be selected according to a position where the boundary appears, so as to comply with the pooling window size of the pooling kernel of 3*3. Therefore, in this exemplary scenario, using max-pooling as an example, there may be eight selection options for first-level pooling data units of the data region, as shown in Table 2.

TABLE 2

Input-Output Correspondence in Max-Pooling

| Serial Number | Input | Output |
|---|---|---|
| 1 | C0, C1, C2 | Max (C0, C1, C2) |
| 2 | C1, C2, C3 | Max (C1, C2, C3) |
| 3 | C2, C3, C4 | Max (C2, C3, C4) |
| 4 | C3, C4, C5 | Max (C3, C4, C5) |
| 5 | C1, C2 | Max (C1, C2) |
| 6 | C2, C3 | Max (C2, C3) |
| 7 | C3, C4 | Max (C3, C4) |
| 8 | C4, C5 | Max (C4, C5) |

In Table 2 above, serial numbers 1 to 4 represent output situations when every three adjacent first-level pooling data units participate in pooling operations in a case that there is no boundary. Serial number 5 represents that the boundary appears between C2 and C3, only C1 and C2 need to participate in the pooling operation, and a column following C2 is padded with 0. Serial number 6 represents that the boundary appears between C1 and C2 or between C3 and C4, which corresponds to the situation in FIG. 6 (b) or FIG. 6 (d), only C2 and C3 need to participate in the pooling operation, and a column in front of C2 or a column following C3 is padded with 0. Serial number 7 represents that the boundary appears between C2 and C3 or between C4 and C5, which corresponds to the situation in FIG. 6 (c) or FIG. 6 (e), only C3 and C4 need to participate in the pooling operation, and a column in front of C3 or a column following C4 is padded with 0. Serial number 8 represents that the boundary appears between C3 and C4 or after C5, and only C4 and C5 need to participate in the pooling operation, which corresponds to the situation in FIG. 6 (d) or FIG. 6 (f), and a column in front of C4 or a column following C5 is padded with 0.

The situation of max-pooling is described in Table 2 above. In mean-pooling, a sum of the first-level sum pooling values of the corresponding first-level pooling data units is calculated, and then a ratio of the sum to 9 is calculated to obtain the second level mean pooling value.

It can be seen from the foregoing embodiment that, not only the feature data but also the first-level pooling values can be multiplexed or reused, thus further improving the efficiency of pooling processing.

As shown in FIG. 2, the pooling processing system further includes a second storage device. The pooling processing method may further include:

determining, by the pooling controller, whether the data in the data region includes data on a boundary of the feature map;

determining, by the pooling controller according to a position of the data on the boundary in the data region, a second-level pooling value corresponding to the feature map from the second-level pooling result and writing the determined second-level pooling value into the second storage device, in a case that the data in the data region includes the data on the boundary of the feature map; and determining, by the pooling controller, a corresponding second-level pooling value from the second-level pooling result and writing the determined second-level pooling value into the second storage device, in a case that the data in the data region does not include the data on the boundary of the feature map.

In the data reading process, data is usually read row by row. Each row of data includes two pieces of boundary data. The two pieces of boundary data belong to the leftmost column and the rightmost column on the feature map respectively. Because the parameter FM_Width changes constantly (particularly going a feature map in one convolutional layer to feature map in another convolutional layer) and cannot be exactly divided by k, feature data written into the data region may also include data on the boundary. When the data in the data region includes the data on the boundary of the feature map, different options in Table 2 need to be selected for pooling calculation according to a position where the boundary appears.

That is, when the data in the data region includes the data on the boundary of the feature map, positions of data belonging to a feature map that requires a pooling operation currently and positions of data not belonging to the feature map (outside the boundary) are determined according to the position where the boundary appears. Only second-level pooling values corresponding to the data belonging to the feature map are obtained and involved in the pooling operation of the current feature map, and second-level pooling values corresponding to the data not belonging to the feature map are not involved in the pooling operation of the current feature map. Moreover, if boundary expansion is needed during calculation of the second level pooling values of the current feature map, the positions of data not belonging to the feature map may be padded with 0, so that a data size for calculation complies with the kernel size of the pooling window of the pooling kernel.

Figure 6:
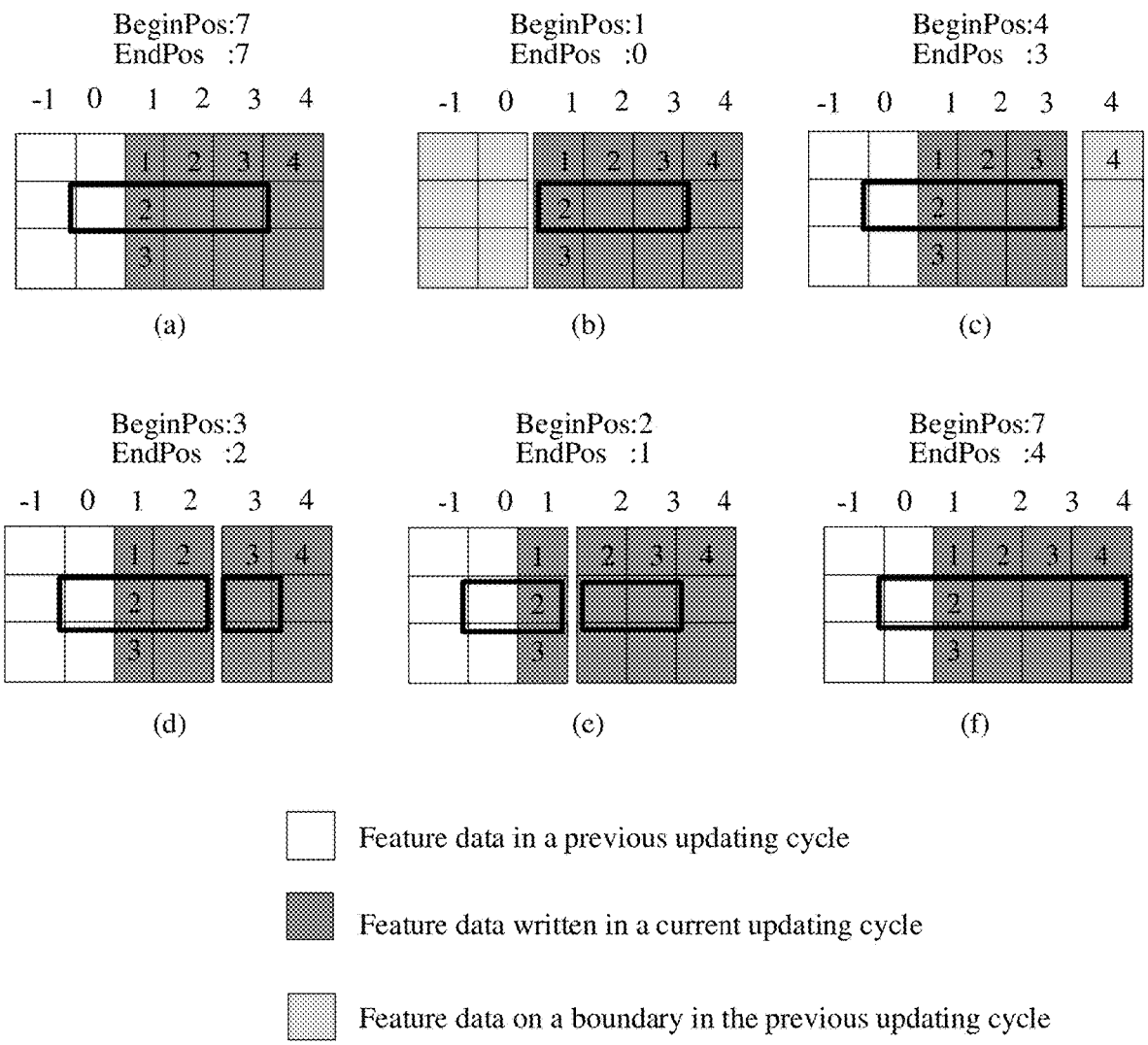
FIG. 6 is a schematic diagram of an example of representation of feature map boundary in data region for pooling in example embodiments of this application.

As shown in FIG. 6, six possible situations data selection in the data region for second level pooling values determination are listed through (a) to (f) in FIG. 6. Two 3-bit quantization parameters are used to indicate a start position and an end position, and the parameters are used for representing or indexing positions of data to be read this time. According to the sequence of C0 to C5, column coordinates thereof (along the first direction) are defined as −1, 0, 1, 2, 3, and 4 in sequence. In this case, (a) to (f) in FIG. 6 represent the following scenarios for the potential feature map boundary positions:

(a) in FIG. 6 represents a normal situation, that is, there is no boundary between any two first-level pooling data units in the current area. In this case, it may be specified that parameter values of the start position and the end position are maximum values of three bits, that is, 7 and 7. Therefore, the start position 7 (BeginPos:7) and the end position 7 (EndPos:7) are used as an index identifier to represent that first-level pooling data units in the data region do not include data on the feature map boundary. Using sliding window stride=1 as an example, it indicates that the sliding window moves by one piece of data each time. In this case, in the data region shown in (a), the sliding window needs to move four times to complete the pooling operation. The four pieces of data framed by the black block in column 0 to column 3 of the second row in (a) represent central data of the sliding window in each movement.

(b) in FIG. 6 represents that a boundary exists between a position 0 and a position 1. In this case, the start position is 1, representing the position of the leftmost column after line feed; the end position is 0, representing the position of the rightmost column before line feed. In this case, the data region shown in (b) includes feature data on the boundary of a feature map in a previous updating cycle. For example, the two columns at the position −1 and the position 0 are both feature data on the boundary of the previous feature map. In the current updating cycle, the feature data on the boundary of the previous feature map does not participate in the pooling operation of the current feature map because the feature data on the boundary of the previous feature map does not participate in the pooling operation of the current feature map. Therefore, the column at the position 0 does not participate in the pooling operation, and thus the pooling process requires three operations, e.g., pooling calculation only needs to be performed on the region from the position 1 to the position 3. If the parameter Padding=1 (for including zero padding), during pooling calculation of the position 1, it is only necessary to pad data required at position 0 with 0. Using sliding window stride=1 as an example, it indicates that the sliding window moves by one piece of data each time. In this case, in the data region shown in (b), the sliding window needs to move three times to complete the pooling operation. The three pieces of data framed by the black block in column 1 to column 3 of the second row in (b) represent central data of the sliding window in each movement.

(c) in FIG. 6 represents that a boundary of a feature map exists between a position 3 and a position 4. In this case, the start position is 4, representing the fourth column from the leftmost side of the current updating cycle and the column immediately after line feed; the end position is 3, representing the position of the rightmost column before line feed. In this case, the data region shown in (c) includes feature data in a previous updating cycle. In the current updating cycle, the column at the position 0 is updated data in the previous cycle, but does not include boundary data, and can participate in the pooling operation. The column at the position 4 is data in the current updating cycle, but is also boundary data of a next feature map, and does not participate in the pooling operation. Therefore, the pooling process requires four operations. In this case, pooling calculation needs to be performed on data from the position 0 to the position 3. Using sliding window stride=1 as an example, it indicates that the sliding window moves by one piece of data each time. Therefore, in the data region shown in (c), the sliding window needs to move four times to complete the pooling operation. The four pieces of data framed by the black block in column 0 to column 3 of the second row in (c) represent central data of the sliding window in each movement. The calculation of column 3 pooling data needs zero padding on the left side.

(d) in FIG. 6 represents that a boundary exists between a position 2 and a position 3. In this case, the start position is 3, representing the third column from the leftmost side of the current updating cycle and the column immediately after line feed; the end position is 2, representing the position of the rightmost column before line feed. In this case, the data region shown in (d) includes feature data in a previous updating cycle. For the current updating cycle, the column at the position 0 includes data in the previous updating cycle, but does not include boundary data. The column at the position 2 includes data read in the current updating cycle, but is also data belonging to the current feature map and can participate in the pooling operation. Therefore, the pooling process requires four operations. Therefore, pooling calculation needs to be performed on data from the position 0 to the position 3. Using sliding window stride=1 as an example, it indicates that the sliding window moves by one piece of data each time. Therefore, in the data region shown in (d), the sliding window needs to move four times to complete the pooling operation. The four pieces of data framed by the black block in column 0 to column 3 of the second row in (d) represent central data of the sliding window in each movement. The pooling of column 2 need zero padding on the left side whereas the pooling of column 3 need zero padding on the left side.

(e) in FIG. 6 represents that a boundary exists between a position 1 and a position 2. In this case, the start position is 2, representing the second column from the leftmost side of the current updating cycle and immediately after line feed; the end position is 1, representing the position of the rightmost column before line feed. In this case, the data region shown in (e) includes feature data in a previous updating cycle. For the current updating cycle, the column at the position 0 is data in the previous updating cycle, but does not include boundary data. The columns at the position 2 and the position 3 are data read in the current reading cycle, but are also data belonging to the current feature map, and can participate in the pooling operation. Therefore, the pooling process requires four operations. In this case, pooling calculation needs to be performed on data from the position 0 to the position 3. Using sliding window stride=1 as an example, it indicates that the sliding window moves by one piece of data each time. Therefore, in the data region shown in (e), the sliding window needs to move four times to complete the pooling operation. The four pieces of data framed by the black block in column 0 to column 3 of the second row in (e) represent central data of the sliding window in each movement. Pooling calculation for column 2 will need zero padding on the left side. Pooling calculation of column 2 will need zero padding on the right side.

(f) in FIG. 6 represents that a boundary is on the right side of the position 4 and is adjacent to the position 4. In this case, the start position is a next column on the right side of the position 4, and is represented by a maximum value 7; the end position is 4. Because the boundary appears in the next column next of the position 4, the current pooling process requires five operations. In this case, pooling calculation needs to be performed on the data from the position 0 to the position 5. Using sliding window stride=1 as an example, it indicates that the sliding window moves by one piece of data each time. Therefore, in the data region shown in (f), the sliding window needs to move five times to complete the pooling operation. The five pieces of data framed by the black block in column 0 to column 4 of the second row in (f) represent central data of the sliding window in each movement. The pooling of column 4 need zero padding on the right side.

The determining, by the pooling controller according to a position of the data on the boundary in the data region, a second-level pooling value corresponding to the feature map from the second-level pooling result and writing the determined second-level pooling value into the second storage device includes:

determining, by the pooling controller, a type index according to the position of the data on the boundary in the data region, the type index being used for an association with a correspondence between distributions of the data on the boundary and the second-level pooling values in the second-level pooling result; and determining, by the pooling controller, the second-level pooling value corresponding to the feature map from the second-level pooling result according to the type index, and writing the determined second-level pooling value into the second storage device.

Figure 7:
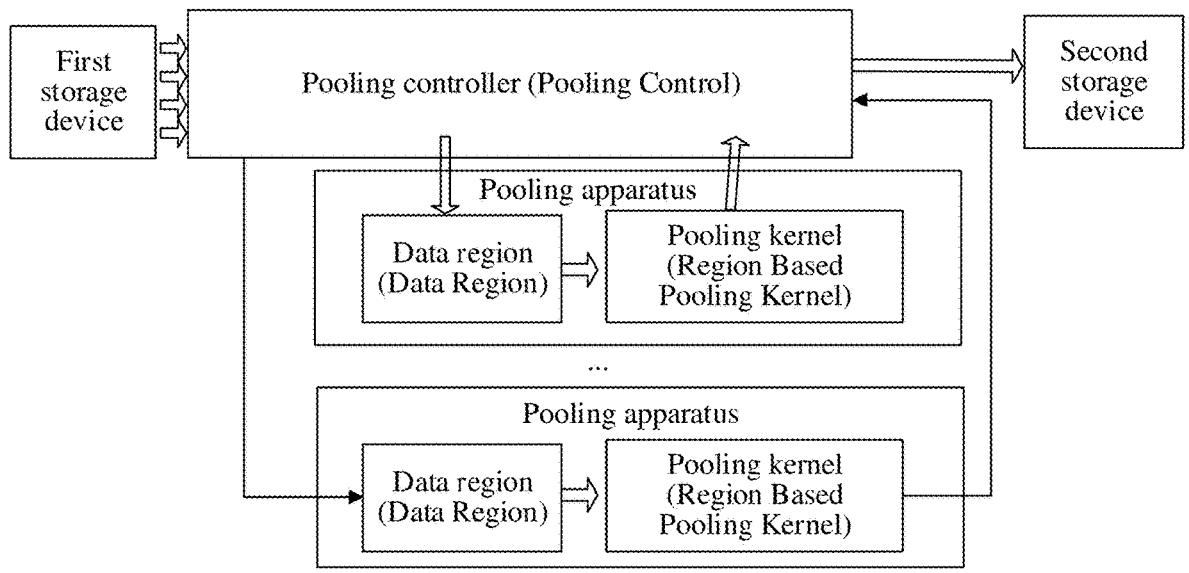
FIG. 7 is a schematic structural diagram of a pooling processing system in an example embodiment of this application.

To improve performance, parallel pooling apparatuses are added to improve the throughput. As shown in FIG. 7, multiple pooling apparatuses may be disposed. The multiple pooling apparatuses may share the pooling controller, to reduce resource consumption.

The foregoing pooling processing procedure may be implemented in an FPGA circuit or an ASIC. The foregoing pooling processing procedure may be applied in a high-performance CNN acceleration chip. In each pooling processing procedure, data is read in the first three cycles, and in the fourth cycle, boundary detection of a Feature Map is enabled and performed, to complete output of three to five pooling results, thus improving the throughput of the pooling processing.

The pooling processing system provided in this embodiment of this application may be deployed in various types of computer devices, for example, applied to a cloud computer device. The computer device may be comprehended with reference to FIG. 8.

Figure 8:
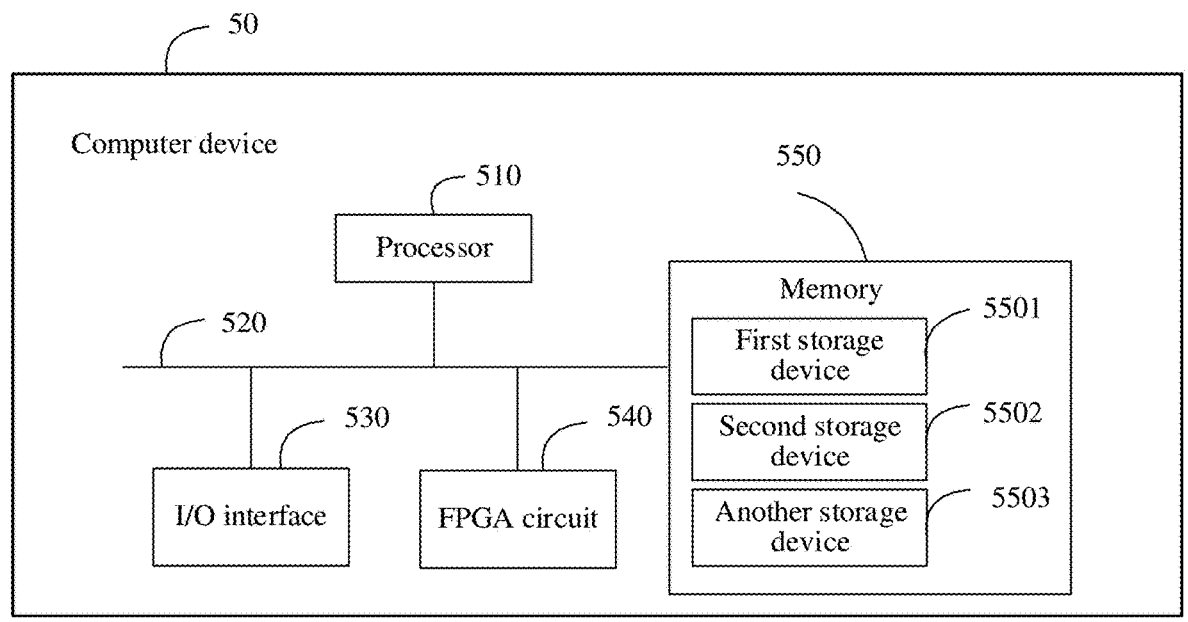
FIG. 8 is a schematic diagram of an embodiment of a computer device in an example embodiment of this application.

FIG. 8 is a schematic structural diagram of a computer device 50 according to an example embodiment of this application. The computer device 50 includes a processor 510, a memory 550, an input/output (I/O) interface 530, and an FPGA circuit 540. The FPGA circuit 540 may include a pooling apparatus in FIG. 2 or FIG. 7. The pooling apparatus includes a pooling processing system. The pooling processing system includes a pooling controller. The pooling apparatus includes a data region and a pooling kernel. The memory 550 may include a first storage device 5501, a second storage device 5502, and another storage device 5503. The another storage device 5503 may include a read-only memory and a random access memory, and provide operating instructions and data for the processor 510. A part of the memory 550 may further include a non-volatile random access memory (NVRAM).

In some implementations, the memory 550 stores the following elements, executable modules or data structures, or a subset thereof, or an extended set thereof:

In this embodiment of this application, in the pooling processing procedure, the FPGA circuit 540 may include:

reading k pieces of feature data from the first storage device in each reading cycle, the k pieces of feature data being included in a feature map generated by a convolution operation, and k being an integer greater than 1;

writing the k pieces of feature data read from the first storage device into the data region, the k pieces of feature data being arranged in a first direction, n*k pieces of data arranged in the first direction in n groups being written into the data region in an updating cycle, duration of the updating cycle being n times the duration of the reading cycle, and n being an integer greater than 1; and transmitting, after the updating cycle is ended, data in the data region to the pooling kernel to perform a pooling operation, the data in the data region including the n*k pieces of data and last m groups or columns of data that are arranged before the n*k pieces of data and that are arranged in a second direction in a previous updating cycle, last m groups of columns of data arranged in the second direction in the updating cycle being temporarily stored in the data region for use in a next updating cycle, and m being a positive integer.

In the pooling processing solution provided in this embodiment of this application, data multiplexing and reuse is implemented through a data region, thus reducing the number of times data are read, improving the efficiency of pooling processing, and improving the processing efficiency of a CNN. Moreover, the number of pieces k of feature data read each time is greater than 1, and the amount of feature data read each time is increased, thus improving a throughput capability of pooling processing.

The processor 510 controls operations of the computer device 50. The processor 510 may also be referred to as a central processing unit (CPU). The memory 550 may include a read-only memory and a random access memory, and provide instructions and data for the processor 510. A part of the memory 550 may also include a non-volatile random access memory (NVRAM). In specific applications, the components of the computer device 50 are coupled together through a bus system 520. In addition to a data bus, the bus system 520 may further include a power bus, a control bus, a signal status bus, and the like. For the clarity of the description, various buses in the figure are all marked as the bus system 520.

The method disclosed in the foregoing embodiment of this application may be implemented by the FPGA circuit 540, and may also be implemented by an ASIC or another programmable logic device, a discrete gate or a transistor logic device, or a discrete hardware component.

Optionally, the FPGA circuit 540 is configured to:

determine a first-level pooling value of each first-level pooling data unit, the first-level pooling data unit being each group of data in the second direction (column), and the first-level pooling value being a maximum value of data included in the first-level pooling data unit or a sum value of data included in the first-level pooling data unit; and determine a second-level pooling result of the data in the data region according to each first-level pooling data unit and a kernel size, the kernel size being quantities of rows and columns of data pooled by the pooling kernel.

Optionally, the FPGA circuit 540 is configured to:

select first-level pooling values of every p adjacent first-level pooling data units (columns), and determine a second-level pooling value over a pxp area, pxp being the kernel size, the second-level pooling value being a maximum first-level pooling value in the p first-level pooling data units or a mean value of the first-level pooling values of the p first-level pooling data units over pxp, and the second-level pooling result including the second-level pooling value of the every p adjacent first-level pooling data units.

Optionally, the FPGA circuit 540 is configured to:

determine whether the data in the data region includes data on a boundary of the feature map;

determine, according to a position of the data on the boundary in the data region, a corresponding second-level pooling value from the second-level pooling result and write the determined second-level pooling value into the second storage device, in a case that the data in the data region includes the data on the boundary of the feature map; and determine a corresponding second-level pooling value from the second-level pooling result and write the determined second-level pooling value into the second storage device, in a case that the data in the data region does not include the data on the boundary of the feature map.

Optionally, the FPGA circuit 540 is configured to:

determine a type index according to the position of the data on the boundary in the data region, the type index being used for an association with a correspondence between distributions of the data on the boundary and the second-level pooling values in the second-level pooling result; and determine the corresponding second-level pooling value from the second-level pooling result according to the type index, and write the determined second-level pooling value into the second storage device.

The foregoing embodiments may be entirely or partially implemented by software, hardware, firmware, or any combination thereof. When implemented by software, the embodiment may be entirely or partially implemented in a form of a computer program product.

The computer program product includes one or more computer instructions. When the computer program instructions are loaded and executed on a computer, all or some of the processes or functions according to the embodiments of this application are generated. The computer may be a general purpose computer, a special purpose computer, a computer network, or another programmable apparatus. The computer instructions may be stored in a computer readable storage medium, or transmitted from one computer readable storage medium to another computer readable storage medium. For example, the computer instructions may be transmitted from one website, computer, server or data center to another website, computer, server or data center in a wired manner (such as a coaxial cable, an optical fiber, a digital subscriber line (DSL)) or a wireless manner (for example, infrared, radio, and microwave). The computer readable storage medium may be any usable medium that can be stored in a computer, or a server, a data center, or other data storage devices including integration of one or more usable media. The usable medium may be a magnetic medium (such as a floppy disk, a hardware disk, or a magnetic tape), an optical medium (such as a DVD), or a semiconductor medium (such as a solid state disk (SSD)), and the like.

A person of ordinary skill in the art may understand that all or some of steps in various methods in the foregoing embodiments may be completed by a program instructing relevant hardware. The program may be stored in a computer readable storage medium. The storage medium may include a ROM, a RAM, a magnetic disk, an optical disc, and the like.

The pooling processing method applied to a convolutional neural network, the pooling processing system of a convolutional neural network, and a computer readable storage medium provided in the embodiments of this application are described in detail above. Specific examples are used herein to illustrate the principle underlying the implementations of this application. The description of the foregoing embodiments is merely used for assisting in comprehension of the method of this application and the core idea thereof. Moreover, a person of ordinary skill in the art may change specific implementations and application ranges according to the idea of this application. In conclusion, the content of this application is not to be construed as a limitation to this application.

What is claimed is:

1. A data pooling method applied to a convolutional neural network, comprising:

receiving a feature map comprising a width dimension and a height dimension;

establishing a data region comprising k+m columns and n rows, k, m, and n being integers;

transferring data blocks each of size k in width and size n in height from the feature map in a width-height sequential scanning order into columns m+1 to k+m and rows 1 to n of the data region in pooling cycles; and in each pooling cycle corresponding to a data block transferred from the feature map to the data region:

retaining columns k+1 to k+m of the data region of a previous pooling cycle to columns 1 to m of the data region;

performing a first level pooling within each column of the data region to obtain k+m first level pooling values; and performing P second level pooling values by pooling P sets of first level pooling values selected according to a position of the data block relative to a width boundary in the feature map, P being an integer.

2. The data pooling method of claim 1, wherein m=ceiling (n/2), where ceiling( ) represents an round-up integer function.

3. The data pooling method of claim 1, wherein P is at most k+ceiling(n/2)−1 and at least k−1.

4. The data pooling method of claim 1, wherein the feature map comprises a convolutional feature map from any one of a plurality of feature maps of multiple convolution layers of the convolutional neural network.

5. The data pooling method of claim 4, wherein the plurality of feature maps varies in size in the width dimension.

6. The data pooling method of claim 4, wherein the feature map is of width M that is non-dividable by k.

7. The data pooling method of claim 1, wherein:

the data region is associated with a column division line separating the data region into a first division comprising a first portion of data columns from before the width boundary in the feature map and a second division comprising a second portion of data columns from after the width boundary in the feature map; and each set of first pooling values of the P sets of first pooling values do not cross the column division line.

8. The data pooling method of claim 7, wherein a position of the column division line is parametrized for determining P and for determining selection of P sets of first level pooling value from the k+m first level pooling values.

9. A device for data pooling method applied to a convolutional neural network, the device comprising a memory for storing the convolutional neural network and computer instructions, and a processor for executing the computer instructions to:

receive a feature map comprising a width dimension and a height dimension;

establish a data region comprising k+m columns and n rows, k, m, and n being integers;

transfer data blocks each of size k in width and size n in height from the feature map in a width-height sequential scanning order into columns m+1 to k+m and rows 1 to n of the data region in pooling cycles; and in each pooling cycle corresponding to a data block transferred from the feature map to the data region:

retain columns k+1 to k+m of the data region of a previous pooling cycle to columns 1 to m of the data region;

perform a first level pooling within each column of the data region to obtain k+m first level pooling values; and perform P second level pooling values by pooling P sets of first level pooling values selected according to a position of the data block relative to a width boundary in the feature map, P being an integer.

10. The device of claim 9, wherein m=ceiling(n/2), where ceiling( ) represents an round-up integer function.

11. The device of claim 9, wherein P is at most k+ceiling (n/2)−1 and at least k−1.

12. The device of claim 9, wherein the feature map comprises a convolutional feature map from any one of a plurality of feature maps of multiple convolution layers of the convolutional neural network.

13. The device of claim 12, wherein the plurality of feature maps varies in size in the width dimension.

14. The device of claim 12, wherein the feature map is of width M that is non-dividable by k.

15. The device of claim 9, wherein:

the data region is associated with a column division line separating the data region into a first division comprising a first portion of data columns from before the width boundary in the feature map and a second division comprising a second portion of data columns from after the width boundary in the feature map; and each set of first pooling values of the P sets of first pooling values do not cross the column division line.

16. The device of claim 15, wherein a position of the column division line is parametrized for determining P and for determining selection of P sets of first level pooling value from the k+m first level pooling values.

17. A non-transitory and computer readable medium, for storing computer instructions, the computer instructions, when executed by a processor, are configured to cause the processor to:

receive a feature map of a convolutional neural network comprising a width dimension and a height dimension;

establish a data region comprising k+m columns and n rows, k, m, and n being integers;

transfer data blocks each of size k in width and size n in height from the feature map in a width-height sequential scanning order into columns m+1 to k+m and rows 1 to n of the data region in pooling cycles; and in each pooling cycle corresponding to a data block transferred from the feature map to the data region:

retain columns k+1 to k+m of the data region of a previous pooling cycle to columns 1 to m of the data region;

perform a first level pooling within each column of the data region to obtain k+m first level pooling values; and perform P second level pooling values by pooling P sets of first level pooling values selected according to a position of the data block relative to a width boundary in the feature map, P being an integer.

18. The non-transitory and computer readable medium of claim 17, wherein m=ceiling(n/2), where ceiling( ) represents an round-up integer function.

19. The non-transitory and computer readable medium of claim 17, wherein P is at most k+ceiling(n/2)−1 and at least k−1.

20. The non-transitory and computer readable medium of claim 17, wherein the feature map comprises a convolutional feature map from any one of a plurality of feature maps of multiple convolution layers of the convolutional neural network.

* * * * *